United States Patent
Hong et al.

(10) Patent No.: US 10,388,619 B2
(45) Date of Patent: Aug. 20, 2019

(54) METHOD OF MANUFACTURING A SEMICONDUCTOR DEVICE AND INTERCONNECTION STRUCTURES THEREOF

(71) Applicant: Amkor Technology, Inc., Tempe, AZ (US)

(72) Inventors: Sung Woong Hong, Buk-gu (KR); Jun Park, Buk-gu (KR); Kyung Han Ryu, Buk-gu (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/835,923

(22) Filed: Aug. 26, 2015

(65) Prior Publication Data

US 2016/0133591 A1 May 12, 2016

(30) Foreign Application Priority Data

Nov. 7, 2014 (KR) .................. 10-2014-0154251

(51) Int. Cl.
*H01L 21/00* (2006.01)
*H01L 23/00* (2006.01)
(Continued)

(52) U.S. Cl.
CPC .............. *H01L 24/11* (2013.01); *H01L 21/78* (2013.01); *H01L 23/544* (2013.01); *H01L 24/03* (2013.01); *H01L 21/565* (2013.01); *H01L 23/3192* (2013.01); *H01L 24/13* (2013.01); *H01L 2223/5442* (2013.01); *H01L 2223/54426* (2013.01); *H01L 2223/54453* (2013.01); *H01L 2224/02375* (2013.01); *H01L 2224/113* (2013.01); *H01L 2224/1148* (2013.01);
(Continued)

(58) Field of Classification Search
CPC ......... H01L 21/02008; H01L 21/02488; H01L 21/02491; H01L 21/02697; H01L 24/11; H01L 24/03; H01L 21/78; H01L 23/544
See application file for complete search history.

(56) References Cited

U.S. PATENT DOCUMENTS 6,271,469 B1    8/2001   Ma et al.
6,372,619 B1 *   4/2002   Huang ................ H01L 23/3114
                                                       257/E21.508
(Continued)

FOREIGN PATENT DOCUMENTS

KR    10-2010-0027716    3/2010
KR    10-2011-0114165    10/2011

OTHER PUBLICATIONS

Korean Office Action dated Feb. 2, 2016 for Korean Patent Application No. 10-2014-0154251.
(Continued)

*Primary Examiner* — Tucker J Wright
*Assistant Examiner* — Wilner Jean Baptiste
(74) *Attorney, Agent, or Firm* — McAndrews, Held & Malloy, Ltd.

(57) ABSTRACT

A semiconductor device and a manufacturing method thereof, which can reduce a size of the semiconductor device. As a non-limiting example, various aspects of this disclosure provide for a reduction in package size based at least in part on patterning techniques for forming interconnection structures.

20 Claims, 6 Drawing Sheets

(51) Int. Cl.
  *H01L 21/78* (2006.01)
  *H01L 23/544* (2006.01)
  *H01L 23/31* (2006.01)
  *H01L 21/56* (2006.01)

(52) U.S. Cl.
  CPC ............ *H01L 2224/13022* (2013.01); *H01L 2224/13024* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/14135* (2013.01); *H01L 2224/94* (2013.01)

(56) References Cited

U.S. PATENT DOCUMENTS

| | | | |
|---|---|---|---|
| 6,784,089 B2* | 8/2004 | Lei | H01L 24/11 257/E21.508 |
| 6,890,829 B2* | 5/2005 | Cheng | H01L 23/5227 257/531 |
| 8,802,495 B2* | 8/2014 | Kim | H01L 24/96 438/107 |
| 8,828,807 B1* | 9/2014 | Wachter | H01L 23/48 257/668 |
| 2002/0070443 A1* | 6/2002 | Mu | H01L 21/561 257/712 |
| 2003/0134496 A1* | 7/2003 | Lee | H01L 23/3114 438/612 |
| 2004/0201097 A1 | 10/2004 | Ohsumi | |
| 2006/0019424 A1* | 1/2006 | Weng | H01L 23/544 438/60 |
| 2009/0152715 A1 | 6/2009 | Shim et al. | |
| 2010/0052164 A1 | 3/2010 | Lee et al. | |
| 2010/0244216 A1 | 9/2010 | Huang et al. | |
| 2011/0183465 A1 | 7/2011 | Gerber et al. | |
| 2011/0204513 A1 | 8/2011 | Meyer et al. | |
| 2012/0015500 A1 | 1/2012 | Lee et al. | |
| 2013/0270697 A1 | 10/2013 | Koike | |
| 2014/0183778 A1* | 7/2014 | Colonna | H01L 23/3157 264/104 |

OTHER PUBLICATIONS

Office Action Report dated Jul. 13, 2016 from Taiwan Patent Application No. 104130423.

* cited by examiner

METHOD OF MANUFACTURING A SEMICONDUCTOR DEVICE AND INTERCONNECTION STRUCTURES THEREOF

CROSS-REFERENCE TO RELATED APPLICATIONS/INCORPORATION BY REFERENCE

The present application makes reference to, claims priority to, and claims the benefit of Korean Patent Application No. 10-2014-0154251 filed on Nov. 7, 2014 in the Korean Intellectual Property Office and titled "METHOD OF MANUFACTURING SEMICONDUCTOR PACKAGE AND SEMICONDUCTOR PACKAGE," the contents of which are hereby incorporated herein by reference, in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate examples of the present disclosure and, together with the description, serve to explain various principles of the present disclosure. In the drawings.

SUMMARY

Various aspects of the present disclosure provide a semiconductor device and a manufacturing method thereof, which can reduce a size of the semiconductor device. As a non-limiting example, various aspects of this disclosure provide for a reduction in package size based at least in part on patterning techniques for forming interconnection structures.

DETAILED DESCRIPTION OF VARIOUS ASPECTS OF THE DISCLOSURE

The following discussion presents various aspects of the present disclosure by providing various examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In line with the trends toward downsizing and mass production of components, growing attention is being paid to smaller package types, for example a wafer level chip scale package (WLCSP). The WLCSP may, for example, be completed by performing a packaging process on a wafer to redistribute circuit terminals and/or by performing a flip-chip bumping process to form a package structure for subsequent singulation. Therefore, the WLCSP and similar packages may have substantially the same size as a semiconductor chip. Also, the entire packaging process or substantial portions thereof may be carried out on a wafer level, thus reducing the manufacturing cost.

In general, the WLCSP or similar package may comprise a semiconductor die having die pads, a dielectric layer (e.g., a passivation layer), a redistribution layer (e.g., one or more conductive layers and one or more dielectric layers), electrical interconnection structures (e.g., conductive bumps, solder bumps, conductive pillars, copper pillars, etc.) and a molded part formed of mold material. Since the interconnection structures may generally be formed to have a constant size, there may be constraints in reducing a distance, between such structures (e.g., a pitch between the centers of adjacent interconnection structures). In addition, since the molded part is generally formed after the interconnection structures are formed, it may be difficult to adjust a thickness of the molded part.

The pitch between the solder bumps and the thickness of the molded part are factors in determining the size of the WLCSP and similar packages. Accordingly, it may be desirable to develop technology for reducing or minimizing the pitch and adjusting the thickness of the molded part.

Various aspects of the present disclosure provide a method of manufacturing a semiconductor package having a reduced or minimized size by patterning the interconnection structures (e.g., solder bumps) in smaller sizes to reduce or minimize a distance between such structures (e.g., to reduce or minimize pitch), and by adjusting a thickness of a molded part in forming the interconnection structures, and a semiconductor package manufactured by the semiconductor package manufacturing method.

Various aspects of the present disclosure provide a method of manufacturing a semiconductor package, the method comprising forming a dielectric layer (e.g., a passivation layer) on a semiconductor die having a plurality of die pads formed thereon, forming a conductive layer (e.g., a redistribution layer) on the dielectric layer and electrically connected to the die pads through an opening the dielectric layer, placing temporary structures (e.g., temporary pattern members) for interconnection structures (e.g., conductive bumps, solder bumps, etc.) on the conductive layer, forming a molded part to cover the dielectric layer, the conductive layer and the temporary pattern members for interconnection structures, thinning (e.g., grinding) the molded part to expose the temporary structures for interconnection structures, removing the exposed temporary structures, and forming interconnection structures (e.g., conductive bumps, solder bumps, etc.) through empty spaces created by removing the temporary structures for interconnection structures.

The above and various other aspects of the present disclosure will be described in or be apparent from the following description of various examples.

Figure 1:
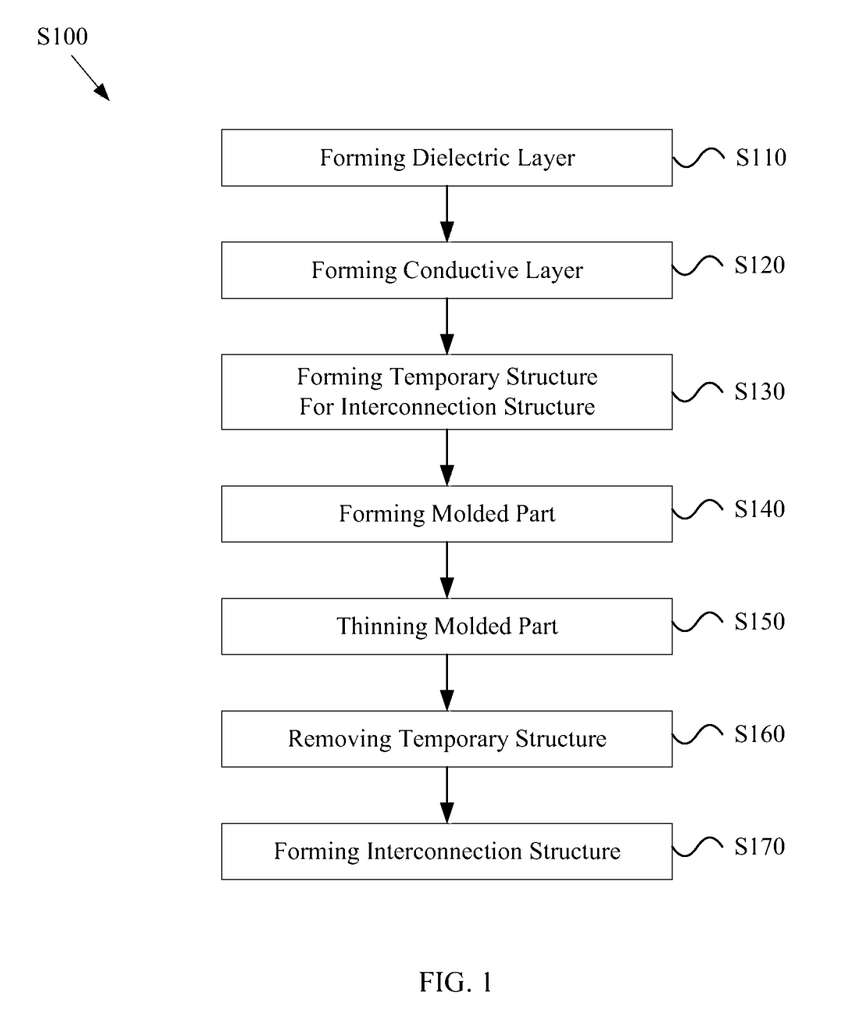
FIG. 1 is a flowchart illustrating a method of manufacturing a semiconductor package according to various aspects of the present disclosure.
Figure 6A:
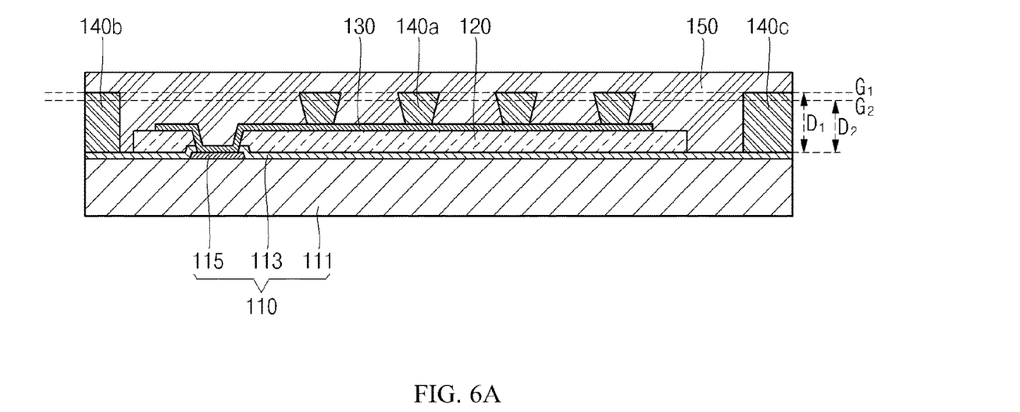
Figure 6B:
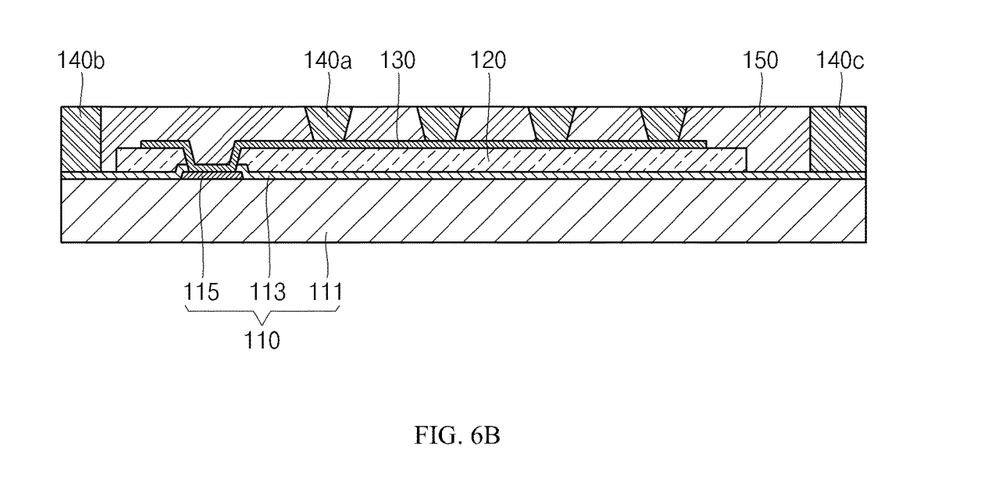
Figure 7:
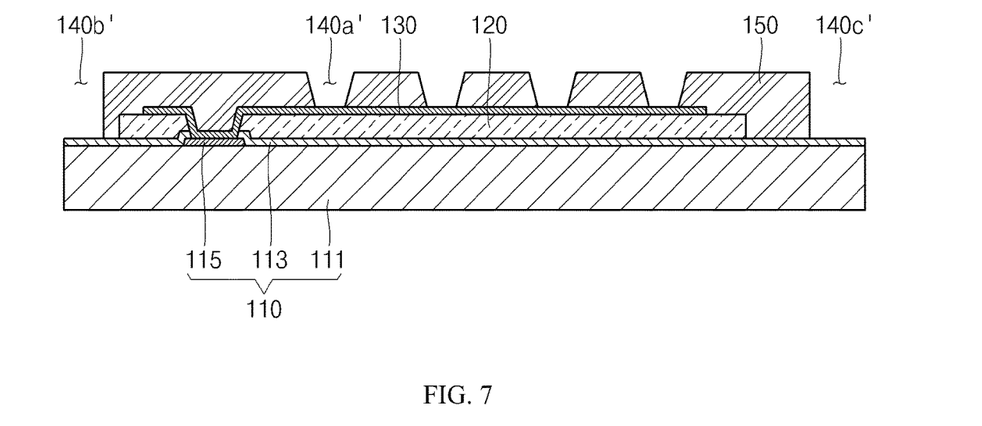
Figure 8:
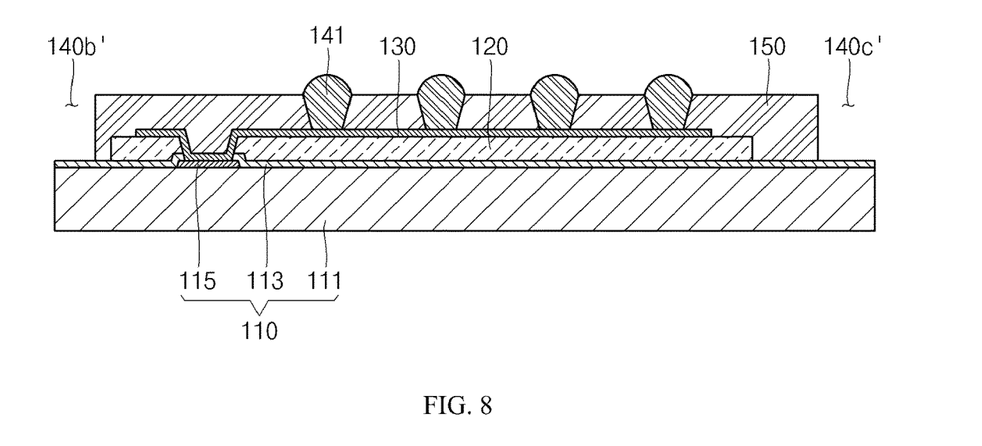
Figure 9:
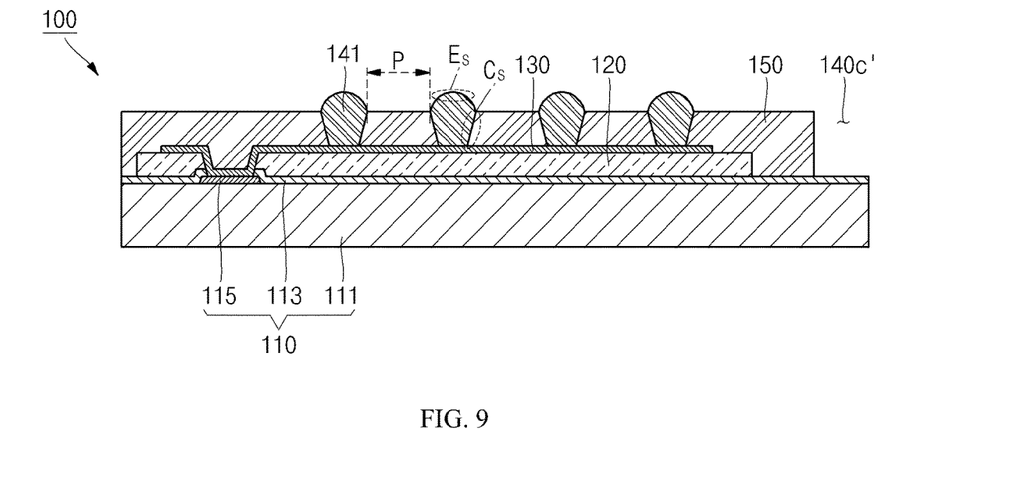
Figure 10:
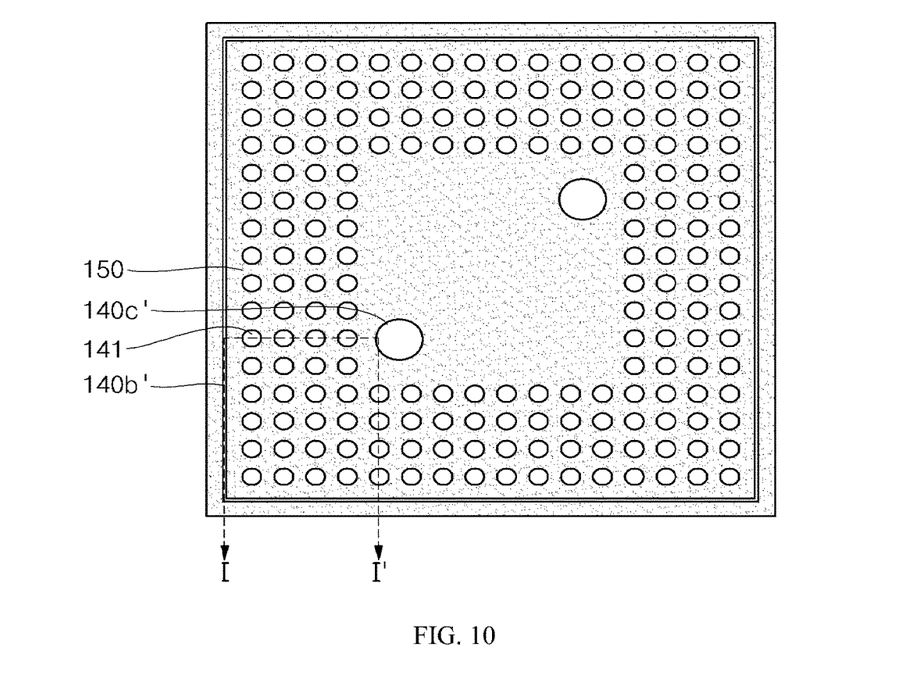
FIG. 10 is a top view of a semiconductor package according to various aspects of the present disclosure.

FIG. 1 is a flowchart illustrating a method of manufacturing a semiconductor package according to various aspects of the present disclosure, FIGS. 2 to 9 are cross-sectional views illustrating a manufacturing sequence of a semiconductor package according to various aspects of the present disclosure, and FIG. 10 is a top view of a semiconductor package according to various aspects of the present disclosure. Specifically, FIG. 8 is a sectional view taken along the line I-I' of FIG. 10.

Referring to FIG. 1, the semiconductor package manufacturing method (S100) according to various aspects of the present disclosure comprises forming a dielectric layer (e.g., a passivation layer) (S110), forming a conductive layer (e.g., a redistribution layer) (S120), placing temporary structures (e.g., temporary pattern members) for interconnection structures (e.g., conductive bumps, solder bumps, etc.) (S130), forming a molded part (S140) (e.g., molding, encapsulating, etc.), thinning (e.g., grinding, etc.) the molded part (S150), removing the exposed temporary structures for interconnection structures (S160), and forming interconnection structures (e.g., conductive bumps, solder bumps, etc.) (S170).

Figure 2:
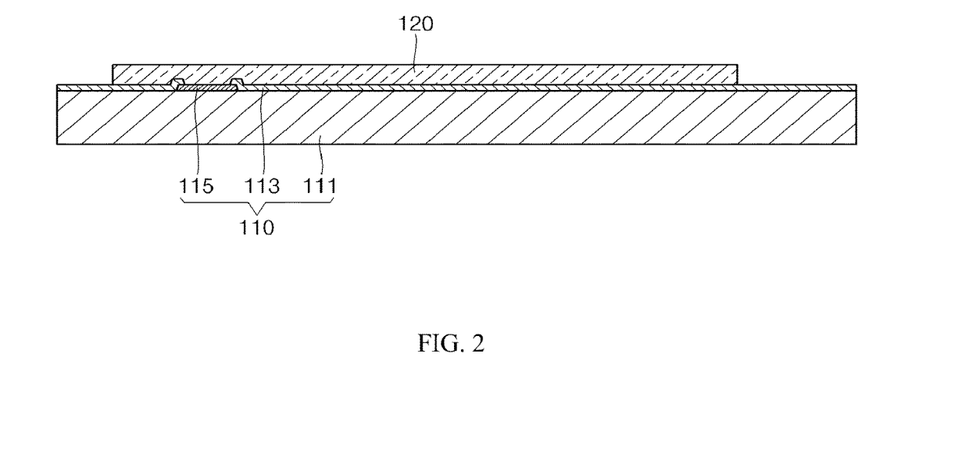
FIGS. 2 to 9 are cross-sectional views illustrating a manufacturing sequence of a semiconductor package according to various aspects of the present disclosure.

As illustrated in FIG. 2, in the forming of the dielectric layer (S110), a second dielectric layer 120 may be formed on a predetermined region on a semiconductor die 110. The second dielectric layer 120 may, for example, comprise one or more of the following: polyimide (PI), benzocyclobutene (BCB), polybenzoxazole (PBO), bismaleimidetriazine (BT), phenolic resin, epoxy, silicone, silicon oxide (SiO2), silicon nitride (Si3N4) and equivalents thereof. The second dielectric layer 120 may also, for example, comprise inorganic materials (e.g., silicon oxide, silicon nitride, etc.). However, the scope of the present disclosure is not limited to such example materials.

The second dielectric layer 120 may be formed in any of a variety of manners, non-limiting examples of which are provided herein. For example, the second dielectric layer 120 may be formed by chemical vapor deposition (CVD). The second dielectric layer 120 may, for example, comprise a laminated film.

The semiconductor die 110 may comprise a semiconductor substrate 111, a first dielectric layer 113 (e.g., a passivation layer) and a die pad 115. The semiconductor substrate 111 may, for example, comprise a silicon material, and a plurality of semiconductor devices (not shown) may be formed in the semiconductor substrate 111.

The first dielectric layer 113 (e.g., a passivation layer) may be formed on a top surface of the semiconductor substrate 111 (e.g., directly on, etc.). The first dielectric layer 113 may, for example, protect the semiconductor substrate 111 from external shocks and may insulate the top surface of the semiconductor substrate 111, except for the die pad 115. The first dielectric layer 113 may, for example, comprise an inorganic material (e.g., silicon oxide, silicon nitride, etc.). The first dielectric layer 113 may also, for example, comprise an organic material, for example one or more of the following: polyimide (PI), benzocyclobutene (BCB), polybenzoxazole (PBO), bismaleimidetriazine (BT), phenolic resin, epoxy, silicone, etc. However, the scope of the present disclosure is not limited to such example materials.

The first dielectric layer 113 may be formed in any of a variety of manners, non-limiting examples of which are provided herein. For example, the first dielectric layer 113 may comprise a native and/or manufactured dielectric (e.g., formed using a low pressure chemical vapor deposition (LPCVD) process.

The die pad 115 may, for example, be formed to be exposed from the first dielectric layer 113, and a plurality of die pads 115 may be provided on the top surface of the semiconductor substrate 111. The die pads 115 may, for example, be electrical input/output terminals of the semiconductor devices (not shown) and may comprise one or more of the following, for example: copper, aluminum, gold, silver, alloys thereof, other conductive materials, etc. However, the scope of the present disclosure is not limited to such example materials.

The die pad(s) 115 may be formed in any of a variety of manners, non-limiting examples of which are provided herein. For example, the die pads 115 may be formed by sputtering, plating, dual damascene process, etc.

Figure 3:
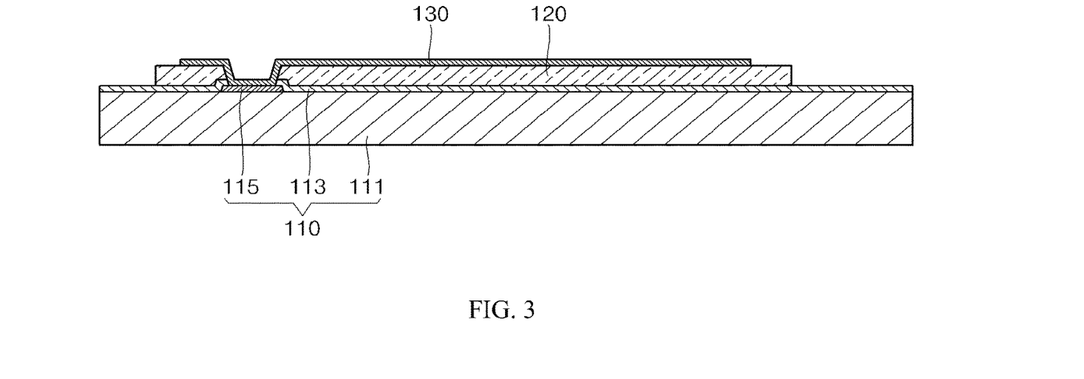

As illustrated in FIG. 3, in the forming of the conductive layer (S120), a conductive layer 130 (e.g., a redistribution layer) formed on the second dielectric layer 120 (e.g., a passivation layer) and electrically connected to the die pad 115 through an opening in the second dielectric layer 120 may be formed. The conductive layer 130 may electrically connect the die pad 115 and interconnection structures 141

(e.g., conductive bumps, etc.) to be formed in a subsequent step, thereby effectively changing or redistributing a position of the die pad 115. The conductive layer 130 may, for example, comprise one or more of the following: copper, aluminum, gold, silver, alloys thereof, other conductive materials, etc. However, the scope of the present disclosure is not limited to such example materials.

Figure 4:
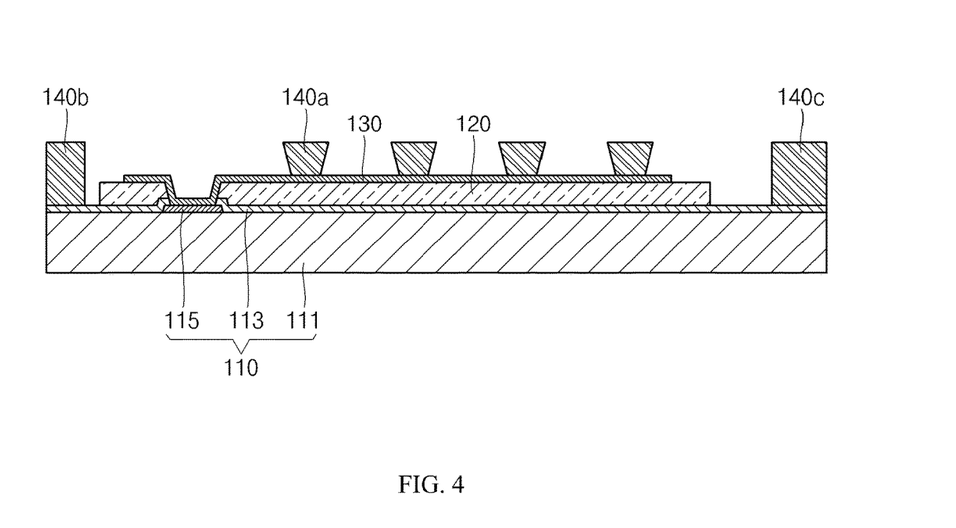

As illustrated in FIG. 4, in the placing of the temporary structure (e.g., temporary pattern member) (S130), a plurality of temporary structures 140a (e.g., temporary pattern members) for interconnection structures may be placed (or formed) on the conductive layer 130. The temporary structures 140a may, for example, be placed at positions where the interconnection structures 141 (e.g., conductive bumps, wafer level bumps, conductive pillars, etc.) are to be formed.

The temporary structures 140a may be formed to have a fine pattern having a size and/or pitch of several tens of micrometers (μm) using, for example, a photoresist or a dry film and may provide a mold of a lower structure of interconnection structures 141 in a subsequent step. For example, the temporary structures 140a may be formed by one or more layers of positive or negative photoresist or dry film. For example, a plurality of layers of gradually increasing lateral dimension may be stacked to form sloped sides of a temporary structure 140a. Also for example, dimensions of the temporary structures 140a may be defined by removing unwanted material (e.g., by ablation).

Lateral surfaces of the temporary structures 140a may, for example, be planar (e.g., generally planar, exactly planar, etc.), unlike external surfaces of the existing interconnection structures (e.g., round spherical and/or cylindrical surfaces). For example, a temporary structure 140 may comprise a shape (e.g., entirely and/or at side surfaces) like that of a cube, a cuboid (e.g., a rectangular cuboid), a pyramid or upside-down pyramid (e.g., a pyramid, a four-sided pyramid, an n-sided pyramid with a truncated apex), etc. Note, however, that the scope of this disclosure is not limited to such planar lateral surfaces.

In addition, as illustrated in FIG. 4, in the placing of the temporary structure (S130), a temporary structure 140b (e.g., a temporary pattern member) for sawing and/or a temporary structure 140c (e.g., a temporary pattern member) for a fiducial mark (also referred to herein as simply a fiducial) may further be placed. The temporary structure 140b for sawing may, for example, be a temporary structure for forming a sawing line (e.g., a wafer sawing line, a package sawing line, etc.) and may, for example, be formed using a photoresist or a dry film. The temporary structure 140c for a fiducial mark may, for example, be a temporary structure for forming a fiducial mark and may, for example, be formed using a photoresist or a dry film. For example, a temporary structure 140a for forming an interconnection structure, a temporary structure 140b for forming a sawing line, and/or the temporary structure 140c for forming a fiducial mark may be formed utilizing a same general process. Note that any number of the temporary structures 140a, 140b, and 140c may be formed.

Figure 5:
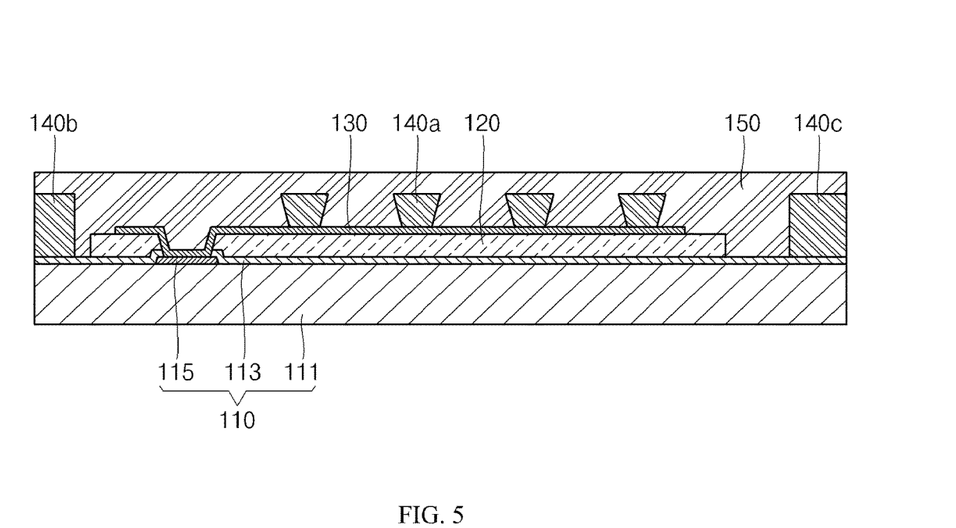

In the forming of the molded part (S140), as illustrated in FIG. 5, a molded part 150 may be formed to cover some or all of the first dielectric layer 113, the second dielectric layer 120, the conductive layer 130, the temporary structure 140a for an interconnection structure, the temporary structure 140b for sawing and the temporary structure 140c for a fiducial mark. The molded part 150 (e.g., formed of mold material) may, for example, comprise molding compound, epoxy, various encapsulating materials, etc. The molded part 150 may, for example, be performed by transfer molding, compression molding, injection molding, over-molding, flooding, general encapsulant deposition, etc. In another example implementation, the molded part 150 may be formed to be coplanar with top surfaces of the temporary structures.

In the thinning (e.g., grinding, abrading, cutting, etc.) of the molded part (S150), for example as illustrated at FIGS. 6A and 6B, the molded part 150 may be subjected to a thinning process to expose the temporary structure 140a for a bump, the temporary structure 140b for sawing and the temporary structure 140c for a fiducial mark. For example, as illustrated in FIG. 6A, the extent of the thinning of the molded part 150 may be adjusted. For example, thinning of the temporary structures 140a, 140b, and 140c is not performed along the line G1 and the thinning of the molded part 150 may be performed to such an extent as to expose top surfaces of the temporary structures 140a, 140b, and 140c. In addition, the thinning of both the molded part 150 and the temporary structures 140a, 140b, and 140c may be performed along the line G2 so as to expose portions of the temporary structures 140a, 140b, and 140c. Final thicknesses D1 and D2 of the molded part 150 may be adjusted by adjusting a thinning level along the line G1 or G2.

In the removing of the temporary structure (S160), for example as illustrated at FIG. 7, a general photoresist or dry film etching process may be performed to remove the temporary structures 140a. In addition, in the removing of the temporary structure (S160), the temporary structure(s) 140a, the temporary structure(s) 140b for sawing and the temporary structure(s) 140c for a fiducial mark may be removed simultaneously.

If the respective temporary structures are all removed, as illustrated in FIG. 7, spaces created by removing the temporary structures 140a may be formed in the molded part 150 as openings (or voids) 140a' for interconnection structures, a space created after removing the temporary structure 140b for sawing may be formed in the molded part 150 as a sawing line 140b', and a space created after removing the temporary structure 140c for a fiducial mark may be formed in the molded part 150 as an opening or void for fiducial mark 140c'. For example, the conductive layer 130 may be exposed through bottom ends of the openings 140a' for interconnection structures. The first dielectric layer 113 may be exposed through the sawing line space 140b' and the fiducial mark space 140c'. Note that the fiducial mark space 140c', or a portion thereof, may be filled with a material to enhance visibility and/or usability of the fiducial mark.

In the forming of the interconnection structures (S170), for example as illustrated at FIG. 8, the openings 140a' for interconnection structures are filled with a conductive material (e.g., a solder, metal, etc.), thereby forming the interconnection structures 141 (e.g., conductive bumps, etc.). The interconnection structures 141 may comprise one or more of the following, for example: tin/lead, leadless tin, metal, copper, silver, gold, aluminum, alloys thereof, other conductive materials, etc. However, the scope of present disclosure is not limited by any particular material.

Thereafter, a singulation process (e.g., sawing, punching, snapping, etc.) may be performed along the sawing line 140b, for example forming a block of a single semiconductor package 100, as illustrated in FIG. 9. The interconnection structures 141 of the thus formed semiconductor package 100 may, for example, be different from conventional solder bumps. Note that the singulation process may, for example, be performed entirely in the sawing line 140b, but may also extend slightly within or outside of the sawing line 140b (e.g., to provide for manufacturing tolerances. In other words, the width of the sawing line 140b may coincide exactly with a width at which a cutting tool cuts, but may also be slightly smaller or larger.

Referring to FIG. 10, the fiducial mark 140c' may be singular or a plurality of such fiducial marks 140c' may be formed for each semiconductor package. As illustrated, the fiducial mark(s) 140c' may be formed in a central area of the semiconductor package (or die) bounded by the interconnection structures 141.

Since conventional solder bumps may for example be spherical, a contact surface between the solder bump and the molded part and an exposed surface of the solder bump protruding from molded part may both be spherical. However, interconnection structures 141 according to various aspects of the present disclosure may have a planar contact surface Cs between each of the temporary structures 140a for interconnection structures and the molded part 150 and a spherical (or rounded) exposed surface Es protruding from the molded part 150. Note, however, that the exposed surface Es need not be rounded (e.g., fully or partially flattened). For example, the lower structure of each of the conductive bumps 141, for example as bounded by the molded part 150, may be shaped as the pattern members 140a for interconnection structures discussed herein, for example like that of a cube, a cuboid (e.g., a rectangular cuboid), a pyramid or upside-down pyramid (e.g., a pyramid, a four-sided pyramid, an n-sided pyramid with a truncated apex), etc. Note, however, that the scope of this disclosure is not limited to such shapes.

According to various aspects of the present disclosure, the interconnection structures 141 may be formed to have fine patterns having a width or diameter of several tens of micrometers (μm) using the temporary structures 140a for interconnection structures, thereby reducing or minimizing a distance between such structures (e.g., a pitch between the centers of adjacent interconnection structures). In addition, an amount of thinning may be adjusted during thinning of the molded part 150, thereby adjusting the final thickness of the molded part 150. As described above, the semiconductor package 100 having a reduced or minimized sized can be manufactured by reducing or minimizing the pitch P between the interconnection structures 141 and/or adjusting the thickness of the molded part 150.

In addition, in the forming of the interconnection structures 141, the sawing line 140b' and the fiducial mark 140c' may be formed simultaneously using the temporary structures 140b and 140c for singulating and as a fiducial mark, so that additional steps are not separately required, thereby reducing manufacturing time.

In summary, various aspects of this disclosure provide a semiconductor device and a method of manufacturing thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing a semiconductor package, the method comprising:
   forming a dielectric layer on a semiconductor die, where the semiconductor die comprises a die pad;
   forming a conductive layer on the dielectric layer, wherein the conductive layer is electrically connected to the die pad through an opening in the dielectric layer;
   forming a first temporary structure on the conductive layer;
   forming a mold material to contact at least a respective portion of each of the dielectric layer, the conductive layer and the first temporary structure;
   thinning the mold material and the first temporary structure;
   removing the first temporary structure from the mold material; and
   forming an interconnection structure in a cavity in the mold material created by said removing the first temporary structure.

2. The method of claim 1, wherein the first temporary structure comprises a photoresist material and/or a dry film material.

3. The method of claim 1, wherein:
   the first temporary structure comprises a top surface, a bottom surface coupled to the conductive layer, and a plurality of side surfaces; and
   at least one of the side surfaces of the interconnection structure is planar and has a non-zero and finite slope.

4. The method of claim 3, wherein each of the plurality of side surfaces of the first temporary structure is planar, and the first temporary structure is shaped like an upside-down pyramid with a truncated apex.

5. The method of claim 1, wherein said forming the first temporary structure comprises stacking a plurality of layers of increasing lateral dimension.

6. The method of claim 1 comprising:
   prior to forming an empty groove in the mold material, forming a second temporary structure on the semiconductor die for singulating the semiconductor package;
   removing the second temporary structure from the mold material, thereby creating the empty groove in the mold material; and
   singulating the semiconductor package at the empty groove.

7. The method of claim 6, wherein said removing the second temporary structure is performed simultaneously with said removing the first temporary structure.

8. The method of claim 6, wherein the first and second temporary structures are formed of a same material in a same process.

9. The method of claim 6, wherein the semiconductor die comprises a lower passivation layer, different from the dielectric layer, through which the die pad is exposed and on which the dielectric layer is formed.

10. The method of claim 9, wherein:
    said forming the dielectric layer comprises forming the dielectric layer directly on the lower passivation layer;
    said forming the conductive layer comprises forming the conductive layer directly on the dielectric layer;
    said forming the first temporary structure comprises forming the first temporary structure directly on the conductive layer; and
    said forming the second temporary structure comprises forming the second temporary structure directly on the lower passivation layer.

11. The method of claim 1, comprising:
    prior to forming an empty fiducial mark in the mold material, forming a second temporary structure for the fiducial mark; and
    removing the second temporary structure from the mold material, thereby forming the empty fiducial mark in the mold material, the fiducial mark different from a cavity for an interconnection structure and different from a singulation groove.

12. The method of claim 11, wherein said removing the second temporary structure from the mold material is performed simultaneously with said removing the first temporary structure.

13. The method of claim 11, wherein said forming the second temporary structure comprises forming the second temporary structure within a central area of the semiconductor package surrounded by a plurality of temporary structures for interconnection structures.

14. A method of manufacturing a semiconductor package, the method comprising:
  forming a conductive layer over a semiconductor die;
  forming a first temporary pattern member for an interconnection structure on the conductive layer, the first temporary structure comprising a first end facing the conductive layer, a second end facing away from the conductive layer, and at least one lateral surface between the first end and the second end;
  forming an encapsulating material to cover at least a respective portion of each of the conductive layer, and the at least one lateral surface of the first temporary pattern member;
  thinning the encapsulating material and the first temporary pattern member;
  removing the first temporary pattern member; and
  forming an interconnection structure in a cavity in the encapsulating material created by said removing the first temporary pattern member.

15. The method of claim 14, wherein the interconnection structure comprises:
  a first portion that extends entirely through the encapsulating material and has a linear profile at an interface between the first portion and the encapsulating material; and
  a second portion that protrudes from the encapsulating material and has a rounded profile.

16. The method of claim 14, wherein:
  the interconnection structure comprises a top surface, a bottom surface coupled to the conductive layer, and a plurality of side surfaces; and
  at least one of the side surfaces of the interconnection structure is planar and has a non-zero and finite slope.

17. The method of claim 14, comprising prior to said forming the encapsulating material:
  forming another temporary pattern member on the semiconductor die for singulating the package and/or for a fiducial, and
  removing the another temporary pattern member from the encapsulating material to create an opening in the encapsulating material for singulating the package and/or for a fiducial.

18. A method of manufacturing a semiconductor device, the method comprising:
  providing a structure comprising:
    a semiconductor die comprising a die pad;
    a dielectric layer on the semiconductor die and comprising an opening through which the die pad is exposed; and
    a conductive layer on the dielectric layer and electrically connected to the die pad through the opening in the dielectric layer;
  forming an encapsulating material to cover at least respective portions of the dielectric layer and the conductive layer, where the encapsulating material comprises a via that extends through the encapsulating material and exposes a portion of the conductive layer; and
  forming an interconnection structure comprising:
    a first portion that extends through the encapsulating material, is entirely laterally surrounded by the encapsulating material, and has a planar profile with a non-zero and finite slope at an interface between the first portion and the encapsulating material; and
    a second portion that protrudes from the encapsulating material and has a rounded profile,
    wherein the first portion of the interconnection structure comprises solder.

19. The method of claim 18, wherein said forming an encapsulating material comprises:
  forming a temporary structure on the conductive layer;
  forming the encapsulating material to cover at least respective portions of the dielectric layer, the conductive layer, and the temporary structure;
  thinning the encapsulating material and the temporary structure; and
  removing the temporary structure, thereby forming a cavity in the encapsulating material.

20. The method of claim 18, wherein the first portion of the interconnection structure comprises at least four planar sides of a same size that contact the encapsulating material.

* * * * *